United States Patent
Mears

(10) Patent No.: US 7,470,380 B2
(45) Date of Patent: Dec. 30, 2008

(54) CONDUCTOR COMPOSITIONS FOR USE IN ELECTRONIC CIRCUITS

(75) Inventor: Sarah Jane Mears, Bristol (GB)

(73) Assignee: E.I. Du Pont De Nemours and Company, Wilmington, DE (US)

( * ) Notice: Subject to any disclaimer, the term of this patent is extended or adjusted under 35 U.S.C. 154(b) by 0 days.

(21) Appl. No.: 10/806,556

(22) Filed: Mar. 23, 2004

(65) Prior Publication Data

US 2004/0222407 A1    Nov. 11, 2004

(51) Int. Cl.
*H01B 1/22*    (2006.01)
*B05D 5/12*    (2006.01)

(52) U.S. Cl. .................. 252/514; 427/96.1; 427/97.1; 428/924

(58) Field of Classification Search .............. 252/512, 252/514
See application file for complete search history.

(56) References Cited

U.S. PATENT DOCUMENTS

| | | | |
|---|---|---|---|
| 3,583,931 A | 6/1971 | Bouchard | |
| 4,366,094 A | 12/1982 | Bushey | |
| 4,381,945 A * | 5/1983 | Nair ........................ | 106/1.14 |
| 4,446,059 A | 5/1984 | Eustice | |
| 4,459,166 A * | 7/1984 | Dietz et al. ............. | 156/89.17 |
| 4,510,179 A | 4/1985 | Honjo et al. | |
| 4,859,505 A | 8/1989 | Nakayama et al. | |
| 5,162,062 A | 11/1992 | Carroll et al. | |
| 5,296,413 A | 3/1994 | Carroll et al. | |
| 5,302,557 A | 4/1994 | Carroll et al. | |
| 5,352,479 A | 10/1994 | Iida et al. | |
| 5,378,406 A | 1/1995 | Nagaoka | |
| 5,378,408 A | 1/1995 | Carroll et al. | |
| 5,518,663 A | 5/1996 | LaBranche et al. | |
| 5,601,638 A | 2/1997 | Fukuda et al. | |
| 5,616,173 A | 4/1997 | Okamoto et al. | |
| 5,670,089 A | 9/1997 | Oba et al. | |
| 5,882,549 A | 3/1999 | Zuber et al. | |
| 6,136,230 A | 10/2000 | Sanada | |
| 6,228,288 B1 * | 5/2001 | Chacko ..................... | 252/511 |
| 6,355,187 B1 | 3/2002 | Sanada et al. | |

FOREIGN PATENT DOCUMENTS

| | | |
|---|---|---|
| EP | 0 720 187 A1 | 7/1996 |
| EP | 0 761 617 A1 | 3/1997 |
| EP | 0 895 252 A1 | 2/1999 |
| EP | 0977 208 A2 | 2/2000 |
| JP | 61 066303 A | 4/1986 |
| JP | 07 302510 A | 11/1995 |
| JP | 09 139112 A | 5/1997 |
| JP | 11-120821 A  * | 4/1999 |
| JP | 2000-285731 * | 10/2000 |
| WO | WO 01/27941 A1 | 4/2001 |
| WO | WO 02/82465 A1 | 4/2002 |
| WO | WO 02/082467 A1 | 10/2002 |
| WO | WO 02/082472 A2 | 10/2002 |

OTHER PUBLICATIONS

U.S. Appl. No. 10/641,889, filed Aug. 14, 2003, Konno.

* cited by examiner

*Primary Examiner*—Mark Kopec
(74) *Attorney, Agent, or Firm*—Barbara C. Siegell

(57) ABSTRACT

A conductive composition consisting essentially of (a) 50-95 wt % finely divided particles of an electrically-conductive material dispersed in (b) a liquid vehicle, for use in the manufacture of an electrically-conductive pattern on a substrate for the use of reducing cross-sectional area and width while retaining conductivity and resistivity.

7 Claims, No Drawings

CONDUCTOR COMPOSITIONS FOR USE IN ELECTRONIC CIRCUITS

FIELD OF THE INVENTION

The present invention relates to conductor compositions and their use in the manufacture of components, particularly heating elements, in microelectronic circuits. These compositions are of particular use in the manufacture of demisting elements in heated windows, for example, in automotive glazing, particularly automotive backlights.

BACKGROUND OF THE INVENTION

The use of thick-film conductors as components in hybrid microelectronic circuits is well known in the electronics field. An important application of patterned electrically-conductive layers is in the automobile industry, and particularly in the manufacture of windows which can be defrosted and/or demisted by an electrically-conductive grid permanently attached to the window and capable of producing heat when powered by a voltage source. The conductive grid generally comprises a series of tracks (or "hot-lines") which are spaced regularly across one surface of the window, usually horizontally, between two "bus-bars" on opposing sides of the window, which are usually disposed vertically. The tracks and bus-bars are normally made from the same composition. Conductive compositions may also be used in various other applications, including printed circuits and heating elements generally, for instance, as base plates in hot water heating appliances. There is a general need within the electronics and electrical industry for lower-cost heating elements, particularly screen-printable heating elements.

Conventional compositions for the manufacture of such components take the form of a paste-like solid-liquid dispersion, where the solid phase comprises finely divided particles of a noble metal or a noble metal alloy or mixtures thereof and an inorganic binder, dispersed into a liquid vehicle. The inorganic binder is typically a glass or glass-forming material, such as a lead silicate, and functions as a binder both within the composition and between the composition and substrate onto which the composition is coated. Due to environmental considerations, the use of lead-containing binders is becoming less common and lead-free binders such as zinc or bismuth borosilicates are now often employed. The inorganic binder, also known as a frit, is considered a key component in conventional compositions.

Additional materials may be added in small quantities (generally less than about 3% by weight of the composition) to modify the properties of the composition and these include staining agents, rheology modifiers, resistivity modifiers, adhesion enhancers and sintering modifiers.

The consistency and rheology of the composition is adjusted to the particular method of application which may comprise screen-printing, brushing, dipping, extrusion, spraying and the like. Typically, screen-printing is used to apply the composition. The pastes are usually applied to an inert substrate, to form a patterned layer. The thick-film conductor layer is normally dried and then fired usually at temperatures between about 400 and 700° C., typically 600-700° C., to volatilize or burn off the liquid vehicle and sinter or melt the inorganic binder and the metal components. Direct wet-firing, i.e. wherein the thick film layer is not dried before firing, has also been used to generate the patterned layer.

In the manufacture of automotive backlights, there is typically an enamel layer coated around the periphery of the backlight, and it is in this area which the bus-bars are normally printed. As used herein, the term "enamel" refers to the layer applied to the surface of a substrate (typically glass) or part thereof onto which a conductor composition is applied. The enamel is a dispersion of a glass or glass-forming frit or binder (as described herein) in powder form in an organic carrier vehicle, normally with additional fillers and/or opacifiers and/or colorants. The enamel is typically colored black in order to provide an obscuration band around the periphery of the backlight. This is done primarily to provide protection against UV attack by sunlight on the adhesive that is used to glue the backlight into the car, but also for cosmetic or decorative purposes. The glass powder of the enamel is designed to soften and flow at the firing temperatures of the backlight to form a film that adheres to the surface of the substrate. The rheological characteristics of the enamel are determined in advance depending on the selected firing temperature of the backlight.

In practice, firing to effect sintering of the conductive pattern is effected in the same stage of manufacture as the firing of the backlight to shape it into its desired form and the firing to effect sintering of the enamel. The process of manufacture therefore comprises the following steps:

(i) printing the enamel composition onto the glass substrate, typically by a screen-printing technique, and then curing the composition by UV-radiation or drying at about 100-200° C. to drive off the solvent;

(ii) printing the conductive composition and optionally drying to drive off solvent; and (iii) firing the coated glass substrate to effect sintering of the layers and forming of the backlight, optionally with a rapid cooling step to produce a toughened glass substrate, in accordance with conventional methods known in the art.

It is also necessary to connect the conductive pattern to the other components of the electronic circuit, such as the power source, resistor and capacitor networks, resistors, trim potentiometers, chip resistors and chip carriers. This is generally achieved by using metal clips, typically comprising copper, which are soldered either directly adjacent to or on top of the conductive layer, usually in the bus-bar sections of the pattern. Where the clips are soldered on top of the conductive layer, attachment is either directly onto the conductive pattern itself or onto a solderable composition which is overprinted onto the pattern (an "over-print"). An over-print is generally applied only in the region of the conductive pattern to which the metal clips are attached by solder, which region is generally referred to as the "clip area". The ability to solder onto the electrically-conductive layer is an important parameter in the manufacture of heating elements since it removes the requirement for an over-print. However, the inorganic binder, which is important for binding the paste onto the substrate, can interfere with solder wetting and result in poor adhesion of the soldered metal clips to the conductive layer. The requirements of high substrate adhesion and high solderability (or adhesion of the metal clips to the conductive pattern) are often difficult to meet simultaneously. It is particularly important to ensure high substrate adhesion in the clip area since it is this area of the conductive pattern that is subjected to the most stress.

It is desired to decrease the visibility of the conductive pattern on the automotive backlight, particularly by decreasing the width of the conductive strips that form the conductive pattern. Typically the width of the conductive strips is about 1 mm in conventional demisting elements. In addition, it is also desired to maintain a high conductivity and low resistivity.

However, it is not desirable to significantly increase the height of the conductive pattern above the surface of the glass backlight, which in conventional backlights is typically about 10 µm. It is therefore desired to reduce the cross-sectional area while retaining conductivity, and one way of achieving this is to increase the fired density of the material in the conductive pattern.

However, there is an upper limit to the concentration of solids for a conductive paste, which is suitable for manufacture of a conductive pattern. When the amount of solids in the dispersion exceeds this limit, the paste becomes difficult to handle in the processes used to manufacture the pattern. Moreover, an increased solids fraction in compositions comprising a conductive component and a frit component in conventional proportions has been found to lead to cracking of the enamel during the firing stage of the manufacture of the backlight.

It is an object of this invention to provide an economical electrically-conductive coating composition suitable for the manufacture of an electrically-conductive pattern, particularly a pattern having narrower width tracks, which exhibits good adhesion to the substrate and avoids or minimizes one or more of the above-mentioned disadvantages, particularly cracking of the enamel on an enamel-coated substrate. It is a further object of this invention to provide an economical electrically-conductive coating composition suitable for the manufacture of an electrically-conductive pattern, particularly a pattern having narrower width tracks, which exhibits good adhesion to the substrate whilst minimizing the cracking of the enamel, and which exhibits high conductivity and low resistivity.

DETAILED DESCRIPTION OF THE INVENTION

Accordingly, the present invention provides a composition suitable for use in the manufacture of an electrically-conductive pattern, said composition comprising finely divided particles of an electrically-conductive material dispersed in a liquid vehicle, wherein an inorganic binder in said composition is present at less than 1.0%, preferably less than 0.8%, preferably less than 0.5%, preferably less than 0.3%, preferably less than 0.1% of the total solids in the composition and is preferably absent from said composition.

It has unexpectedly been found that it is not necessary to utilize an inorganic binder in the conductive composition in order to achieve good adhesion, particularly to an enamel-coated substrate, and that a reduction in the amount of inorganic binder avoids or minimizes the cracking of enamel. Such compositions are suitable for manufacturing conductive patterns having tracks of a reduced cross-sectional area and width whilst retaining high conductivity and low resistivity.

The compositions described herein are suitable for use as paste compositions for forming thick-film conductive patterns on a substrate, for instance, by the process of screen-printing. The compositions of the present invention are of particular use as components in the manufacture of windows that can be defrosted and/or demisted by an electrically-conductive grid attached to the window, particularly for use in automotive industry.

As used herein, the term "finely divided" is intended to mean that the particles are sufficiently fine to pass through a 325-mesh screen (US standard sieve scale). It is preferred that at least 50%, preferably at least 90%, and more preferably substantially all of the particles are in the size range of 0.01 to 20 µm. Preferably, the largest dimension of substantially all particles is no more than about 10 µm and desirably no more than about 5 µm.

As used herein, the term "inorganic binder" refers to any material, which upon sintering serves to bind the metal to a substrate such as a glass (including toughened and laminated glass), enamel, enamel-coated glass, ceramic, alumina or metal substrate. The binder generally has a softening point of between about 350 and 620° C. in order that the compositions can be fired at the desired temperatures (typically 400 to 700° C., particularly 580 to 680° C.) to effect sintering, wetting and adhesion to the substrate. Examples of inorganic binders include lead borates; lead silicates; lead borosilicates; cadmium borate; lead cadmium borosilicates, zinc borosilicates; sodium cadmium borosilicates; bismuth silicates; bismuth borosilicates; bismuth lead silicates; bismuth lead borosilicates; oxides or oxide precursors of metals such as zinc, cobalt, copper, nickel, manganese or iron.

The electrically-conductive particles can be in any form suitable for the production of the compositions of the present invention. For example, electrically-conductive metallic particles may bin in the form of either metal powders or metal flakes or blends thereof. In one embodiment of the invention, the metallic particles are a blend of powder and flake. The particle size of the metal powder or flake is not by itself narrowly critical in terms of technical effectiveness. However, particle size does affect the sintering characteristics of the metal in that large particles sinter at a lower rate than small particles. Blends of powders and/or flakes of differing size and/or proportion can be used to tailor the sintering characteristics of the conductor formulation during firing, as is well-known in the art. The metal particles should, however, be of a size that is appropriate to the method of application thereof, which is usually screen printing. The metal particles should therefore generally be no larger than about 20 µm in size and preferably less than about 10 µm. The minimum particle size is normally about 0.1 µm.

The metals used for the electrically-conductive material are typically selected from silver, gold, platinum and palladium. The metal can be used either in isolation or as a mixture that forms an alloy upon firing. Common metal mixtures include platinum/gold, palladium/silver, platinum/silver, platinum/palladium/gold and platinum/palladium/silver. The electrically-conductive material may also comprise other metals such as tin, aluminum, zinc, copper, cobalt, nickel, iron, and bismuth, either in the form of metallic particles or in the form of particles of an alloy containing such metal(s) or in the form of a derivative which is substantially converted to the metal under the action of heat. In one embodiment, the metals are selected from silver, optionally mixed with palladium, platinum and/or gold, and preferably from silver and silver/palladium. The preferred metal for the electrically-conductive material is silver. Thus, the electrically conductive component preferably comprises at least 90%, preferably at least 95%, preferably at least 98%, preferably at least 99% by weight silver, and preferably substantially all of the electrically-conductive component is silver. It is preferred that the compositions contain at least 50% weight silver particles larger than 1.0 µm.

The size of the particles should generally be no larger than about 20 µm and preferably less than 10 µm. The particles may be spherical or spheroid or irregular in shape, in the form of a flake or a powder, or in any other suitable morphology.

In order to facilitate the transfer of the electrically-conductive material onto the substrate, it is dispersed into a liquid vehicle to form a semi-fluid paste, which is then printed in a desired circuit pattern. The liquid vehicle may be an organic medium or may be aqueous-based. Preferably the liquid vehicle is an organic medium. Any suitably inert liquid can be used as an organic medium. The liquid vehicle should provide acceptable wettability of the solids and the substrate, a relatively stable dispersion of particles in the paste, good printing performance, dried film strength sufficient to withstand rough handling, and good firing properties. Various organic liquids with or without thickening agents, stabilizing agents and/or other common additives are suitable for use in the preparation of the compositions of the present invention. Exemplary of the organic liquids which can be used are alcohols (including glycols); esters of such alcohols such as the acetates, propionates and phthalates, for instance dibutyl phthalate; terpenes such as pine oil, terpineol and the like; solutions of resins such as polymethacrylates of lower alcohols; or solutions of ethyl cellulose in solvents such as pine oil and monobutyl ether of diethylene glycol. The vehicle can also contain volatile liquids to promote fast setting after application to the substrate.

A preferred organic medium is based on a combination of a thickener consisting of ethyl cellulose in terpineol (typically in a ratio of 1 to 9), optionally combined for instance with dibutyl phthalate or with the monobutyl ether of diethylene glycol (sold as butyl Carbitol™). A further preferred organic medium is based on ethyl cellulose resin and a solvent mixture of alpha-, beta- and gamma-terpineols (typically 85-92% alpha-terpineol containing 8-15% beta and gamma-terpineol).

The compositions described herein may additionally comprise further additives known in the art, such as colorants and staining agents, rheology modifiers, metallic resistivity modifiers, adhesion enhancers, sintering inhibitors, green-state modifiers, surfactants and the like.

In a preferred embodiment, the electrically-conductive material comprises at least 95%, preferably at least 96%, preferably at least 97%, preferably at least 98%, more preferably at least 99%, and preferably substantially all of the solid phase material use dot prepare the compositions of the invention.

The ratio of liquid vehicle to solids in the dispersion is in part determined by the final desired formulation viscosity which, in turn, is determined by the printing requirements of the system. Normally, in order to achieve good coverage, the dispersions will contain about 50 to about 95%, preferably about 70 to about 95%, more preferably from about 80 to about 95%, and more preferably from about 85 to about 95% by weight solids, and about 5 to 50% by weight liquid vehicle.

In the preparation of the compositions described herein, the particulate solids are mixed with the liquid vehicle and dispersed with suitable equipment, such as a three-roll mill or a power-mixer, according to conventional techniques well-known in the art, to form a suspension. The resulting composition has a viscosity generally in the range of about 10-500, preferably in the range of about 10-200, more preferably in the range of about 15-100 Pa.s at a shear rate of 4 sec$^{-1}$, for instance, as measured on a Brookfield HBT viscometer using a utility cup and a No. 14 spindle at 10 rpm and 25° C. The general procedure for preparing the compositions described herein is set out below.

The ingredients of the paste are weighed together in a container. The components are then vigorously mixed by a mechanical mixer to form a uniform blend; then the blend is passed through dispersing equipment, such as a three-roll mill, to achieve a good dispersion of particles to produce a paste-like composition having a suitable consistency and rheology for application onto a substrate, for instance by screen-printing. A Hegman gauge is used to determine the state of dispersion of the particles in the paste. This instrument consists of a channel in a block steel that is 25 μm deep (1 mil) on one end-and ramps up to zero depth at the other end. A blade is used to draw down paste along the length of the channel. Scratches appear in the channel where the agglomerates' diameter is greater than the channel depth. A satisfactory dispersion will give a fourth largest scratch point of typically 1-18 μm. The point at which half of the channel is uncovered with a well-dispersed paste is between 3 and 8 μm typically. Fourth scratch measurements of >20 μm and "half-channel" measurements of >10 μm indicate a poorly dispersed suspension.

The compositions are then applied to a substrate using conventional techniques known in the art, typically by the process of screen printing, to a wet thickness of about 20-60 μm, preferably about 35-50 μm. The compositions described herein can be printed onto the substrates either by using an automatic printer or a hand printer in the conventional manner. Preferably, automatic screen printing techniques are employed using screens with at least 45 yarns/cm, and preferably at least 77 yarns/cm. The printed pattern is optionally dried at below 200° C., preferably at about 150° C., for a time period between about 30 seconds to about 15 minutes before firing. Firing to effect sintering of the particles is preferably done in a well-ventilated belt conveyor furnace with a temperature profile that will allow burn-off of the vehicle at about 200° C.-500° C., followed by a period of maximum temperature of about 500-1000° C., preferably about 600-850° C., lasting for about 30 seconds to about 15 minutes. This is followed by a cooldown cycle, optionally a controlled cooldown cycle, to prevent over-sintering, unwanted chemical reactions at intermediate temperatures or substrate fracture, which can occur from too rapid cooldown. The overall firing procedure will preferably extend over a period of about 2-60 minutes, with about 1-25 minutes to reach the firing temperature, about 10 seconds to abut 10 minutes at the firing temperature and about 5 seconds to 25 minutes in cooldown. For the manufacture of a toughened glass substrate, a controlled cooldown cycle is generally used wherein the overall firing procedure typically extends over a period of about 2 to 5 minutes, with about. 1 to 4 minutes to reach the firing temperature, followed by a rapid cooldown.

Typical thicknesses of the thick-films after firing are from about 3 μm to about 40 μm, preferably from about 8 μm to about 20 μm, more preferably from about 5 to 15 μm, and typically about 10 μm. Typical widths of the individual tracks in the conductive pattern after firing are 1 mm or less, preferably 400 μm or less, more preferably 300 μm or less, and more preferably 250 μm or less.

The compositions described herein are primarily intended for use in the manufacture of heating elements in windows such a defogging or defrosting elements in automotive glazing, particularly backlights. In order for the window to defrost quickly, the circuit must be capable of supplying large amounts of power from a low voltage power source, typically 12 volts. For such power sources the resistivity requirement of the conductive pattern is generally in the range of from about 1.5 to about 15 μΩcm, preferably from about 1.5 to about 4 μΩcm.

The compositions may also be used to incorporate other conductive functions into the window, such as a printed aerial or antenna. The coating compositions can be employed in various other applications, including printed circuits and heating elements generally. For instance, the compositions described herein may be used as base plates in hot water heating appliances.

According to a further aspect of the invention there is provided a process for the manufacture of an electrically-conductive pattern, said process comprising:

(i) providing a substrate;

(ii) providing on at least a part of said substrate a layer of enamel, and optionally curing or drying the enamel as described herein;

(iii) applying onto said enamel a conductive composition comprising finely divided particles of an electrically-conductive material dispersed in a liquid vehicle, wherein an inorganic binder in said composition is present at less than 1.0%, preferably less than 0.8%, preferably less than 0.5%, preferably less than 0.3%, preferably less than 0.1% of the total solids in the composition and is preferably absent from said composition, and optionally drying said conductive composition;

(iv) firing the coated substrate.

Preferably, the process for depositing said enamel and/or said electrically conductive composition is a screen-printing process.

The substrate is typically a rigid substrate such as glass. The firing process may optionally include a rapid cool-down stage for the manufacture of toughened glass.

According to a further aspect of the present invention there is provided a substrate having on at least a part thereof a layer of enamel, and on at least a part of said enamel an electrically-conductive pattern, said composition comprising finely divided particles of an electrically-conductive material dispersed in a liquid vehicle, wherein an inorganic binder in said composition is present at less than 1.0%, preferably less than 0.8%, preferably less than 0.5%, preferably less than 0.3%, preferably less than 0.1% of the total solids in the composition and is preferably absent from said composition.

According to a further aspect of the invention, there is provided use of the conductive composition described herein in the manufacture of an electrically conductive pattern.

The following procedures are used to evaluate the compositions described herein.

Adhesion

Copper clips (obtained from Quality Product Gen. Eng. (Wickwar), UK) are soldered to the fired conductive pattern on a glass substrate (dimensions 10.2 cm×5.1 cm×3 mm) using a 70/27/3 Pb/Sn/Ag solder alloy at a soldering iron temperature of 350 to 380° C. A small quantity of a mildly active rosin flux, such as ALPHA 615-25® (Alpha Metals Limited, Croydon, U.K.) may be used to enhance solder wetting and to keep the !solder and clip in place during assembly of parts, in which case the flux is applied to the solder using a shallow tray containing a thin film of fresh flux. Adhesion is measured on a Chattillon® pull tester Model USTM at a pull speed of 0.75±0.1 inches per minute (1.91±0.25 cm per minute) and the pull strength recorded at adhesion failure. The average value of adhesion failure over 8 samples is determined. The adhesion should preferably be greater than 10 kg, more preferably greater than 15 kg and more preferably greater than 20 kg.

Resistance and Resistivity

The resistance of the fired conductive pattern on a glass substrate (dimensions 10.2 cm×5.1 cm×3 mm) is measured using a GenRad Model 1657 RLC bridge calibrated for use between 1 and 900 Ω or equivalent. The thickness of the conductive layer is measured using a thickness measuring device such as a surf-analyzer (e.g. TALYSURF (a contact measuring device which analyzes the substrate surface in 2 dimensions using a spring loaded stylus; any change in height deflects the stylus, which is registered on a recorder, such as a chart recorder; the difference between the base line and average height gives the print thickness). Resistance of the pattern is determined by placing the probe tips at the point where the conductive track meets the solder pads. The bulk resistivity (thickness-normalized) of the layer is determined by dividing the measured resistance for the pattern by the number of squares therein where the number of squares is the length of the conductive track divided by the width of the track. The resistivity value is obtained as mΩ/square at a normalized thickness, herein 10 μm, and presented herein in the units of μΩcm.

Particle Size

The state of dispersion of the paste during manufacture is measured according to ASTM D1210-79 using a large Hegman type fineness of grind gauge. The particle size distribution of the conductive particles is measured using a Microtrac™ II Particle Size Analyzer Model 7997 (Leeds and Northrop) and the d50 value calculated (i.e. the size below which 50% of the particles lie).

The invention will now be described with reference to the following examples. It will be appreciated that the examples are not intended to be limiting and modification of detail can be made without departing from the scope of the invention.

EXAMPLES

Conductive patterns were prepared using the method hereinbefore described. The silver particles were a mixture of 66% irregular-shape silver particles (d50=5.4 to 11 μm), 11% spherical silver particles (d50=0.4 to 0.9 μm) and 11% flake silver particles (d50 of approximately 2.0 μm). The binder used was a composition comprising $Bi_2O_3$ (69.82%), $B_2O_3$ (8.38%), $SiO_2$ (7.11%), CaO (0.53%), ZnO (12.03%) and $Al_2O_3$ (2.13%). The liquid vehicle was comprised primarily of ethyl cellulose in terpineol (in a ratio of 1 to 9) combined with the monobutyl ether of diethylene glycol (sold as butyl Carbitol™) for rheology adjustment. The substrate was a glass substrate coated with Cerdec 14252 enamel (Cerdec, NL; Ferro (Holland) BV, NL). All parts were fired through a belt furnace with a peak firing temperature of 660° C., with the samples spending approximately 72 s at peak temperature. The total door-to-door transit time in the furnace was approximately 21 minutes. The fired film thickness is shown in Table 1 below.

TABLE 1

| | Example 1 | Comparative Example 1 |
|---|---|---|
| Silver content (%) | 94 | 88 |
| Binder content (%) | 0 | 4 |
| Organic content (%) | 6 | 8 |
| Fired film thickness (μm) | 40 | 35 |
| Resistance (μΩ cm) | 0.91 | 1.05 |
| Resistivity (mΩ/square) | 3.64 | 3.68 |
| Adhesion (Kg) | 34.5 | 32 |
| Cracking of enamel | Did not crack | Cracked |

The invention claimed is:

1. A conductive composition, for use as a coating on a substrate, consisting of:

(a) finely divided particles of an electrically conductive material selected from the group consisting of silver, gold, platinum, palladium, and mixtures thereof;

(b) a lead-free inorganic binder; dispersed in (c) a liquid vehicle wherein the total composition contains 50-95% by weight solids and wherein said inorganic binder is present at less than 0.8% of the total solids in the composition.

2. The composition of claim 1, wherein said inorganic binder consists essentially of $Bi_2O_3$, $B_2O_3$, $SiO_2$, CaO, ZnO, and $Al_2O_3$.

3. The composition of claim 1, including a binder in an amount of less than 0.5% based on the total weight of the composition.

4. The composition of claim 1, including a binder in an amount of less than 0.3% based on the total weight of the composition.

5. The composition of claim 1, including a binder in an amount of less than 0.1% based on the total weight of the composition.

6. A process for the manufacture of an electrically-conductive pattern, said process comprising:
   providing a substrate;
   providing on at least a part of said substrate a layer of enamel;
   applying onto said enamel the conductive composition of any one of claim 1 firing the coated substrate.

7. An article comprising a substrate having on at least a part thereof a layer of enamel, and on at least a part of said enamel an electrically-conductive pattern, said electrically-conductive pattern is formed from a conductive composition according to claim 1.

* * * * *